US006781426B2

(12) United States Patent
Souchkov

(10) Patent No.: US 6,781,426 B2
(45) Date of Patent: Aug. 24, 2004

(54) NANOSECOND MONOLITHIC CMOS READOUT CELL

(75) Inventor: Vitali V. Souchkov, Walnut Creek, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 10/206,753

(22) Filed: Jul. 26, 2002

(65) Prior Publication Data

US 2003/0020517 A1 Jan. 30, 2003

Related U.S. Application Data

(60) Provisional application No. 60/308,230, filed on Jul. 26, 2001.

(51) Int. Cl.[7] .................................................. H03L 7/00
(52) U.S. Cl. .......................... 327/154; 327/164; 327/379
(58) Field of Search ................................. 327/154, 164, 327/291, 379, 389, 391

(56) References Cited

U.S. PATENT DOCUMENTS

| 4,445,093 A | * | 4/1984 | Kohler ........................ 327/58 |
| 4,539,527 A | * | 9/1985 | Ishigaki et al. ............. 330/149 |
| 6,265,864 B1 | * | 7/2001 | De Winter et al. ...... 324/207.2 |
| 6,400,211 B1 | * | 6/2002 | Yokomizo et al. .......... 327/536 |

* cited by examiner

*Primary Examiner*—Kenneth B. Wells
(74) *Attorney, Agent, or Firm*—Henry P. Sartorio; Joseph R. Milner

(57) ABSTRACT

A pulse shaper is implemented in monolithic CMOS with a delay unit formed of a unity gain buffer. The shaper is formed of a difference amplifier having one input connected directly to an input signal and a second input connected to a delayed input signal through the buffer. An elementary cell is based on the pulse shaper and a timing circuit which gates the output of an integrator connected to the pulse shaper output. A detector readout system is formed of a plurality of elementary cells, each connected to a pixel of a pixel array, or to a microstrip of a plurality of microstrips, or to a detector segment.

15 Claims, 8 Drawing Sheets

NANOSECOND MONOLITHIC CMOS READOUT CELL

RELATED APPLICATIONS

This application claims priority of Provisional Application Ser. No. 60/308,230 filed Jul. 26, 2001.

GOVERNMENT RIGHTS

The United States Government has rights in this invention pursuant to Contract No. DE-AC03-76SF00098 between the United States Department of Energy and the University of California.

BACKGROUND OF THE INVENTION

The invention relates to readout systems for segmented detectors, including pixel arrays, and more particularly to pulse shapers, including timing circuitry, therefor.

The introduction of pixel detectors in tracking applications has set the demand for high density readout electronics consisting of one cell per pixel with the task of identifying the address of the pixels where signals above a preset threshold are recorded. The same readout electronics associated with a histogramming memory to build-up the distribution of counts recorded by each pixel in a fixed time interval is employed in imaging applications. In either case, only the presence of a signal is recorded by the readout system.

There are, however, situations, where signal-related parameters are to be extracted and a readout that is able to acquire and process multiparametric information is required. For example, if the value of the charge associated with the signal is available, it is possible to increase the position resolution well beyond the geometric size of the pixel by using an interpolation approach.

Signal timing is important in several time-resolved or time-correlated position sensing and imaging applications. Examples of situations requiring both position and time information are provided by Time-of-Flight mass spectroscopy and by the analysis of reactions initiated by photoionization (molecular dissociation), where the photoionization produced by laser light results in fragmentation. Multi hit time-resolved detection may be required in this case. Another example of a situation demanding accurate timing is three dimensional imaging based upon time-domain reflectometry associated with a pixel matrix.

The idea of multiparametric acquisition from pixel matrices can be extended to more complex cases including other signal features, for instance, shape-related parameters.

One particular type of system intended to readout multiparametric information from a matrix of pixels acquires the charge associated with the signal and provides timing information from each pixel. Although it lends itself to a broad range of time-correlated imaging situations involving any kind of pixel matrices, a particular application is to pixels that sense the output charge distribution from a Micro Channel Plate (MCP). The combination of a microchannel plate and a pixel matrix is an extremely versatile detector and the readout system must be able to fully exploit the intrinsically high position resolution and time accuracy featured by the MCP.

SUMMARY OF THE INVENTION

The invention is a system to readout multiparametric information from a matrix of pixels or other segmented detector. The system acquires charge associated with a signal and provides timing information from each pixel or other detector segment. Although it can be used in a broad range of time-correlated imaging situations involving any kind of pixel matrices, the system particularly applies to pixels that sense the output charge distribution from a Micro Channel Plate (MCP). The combination of a microchannel plate and a pixel matrix is an extremely versatile detector and the readout system must be able to fully exploit the intrinsically high position resolution and time accuracy featured by the MCP. The readout system of the present invention meets these requirements and provides a significant functional improvement over conventional pixel systems.

The invention includes a pulse shaper implemented in monolithic CMOS with a delay unit formed of a unity gain buffer. The shaper is formed of a difference amplifier having one input connected directly to an input signal and a second input connected to a delayed input signal through the buffer. The invention also includes an elementary cell based on the pulse shaper and a timing circuit which gates the output of an integrator connected to the pulse shaper output. The invention further includes a detector readout system formed of a plurality of elementary cells, each connected to a pixel of a pixel array, or to a microstrip of a plurality of microstrips, or to a detector segment.

DETAILED DESCRIPTION OF THE INVENTION

Figure 1:
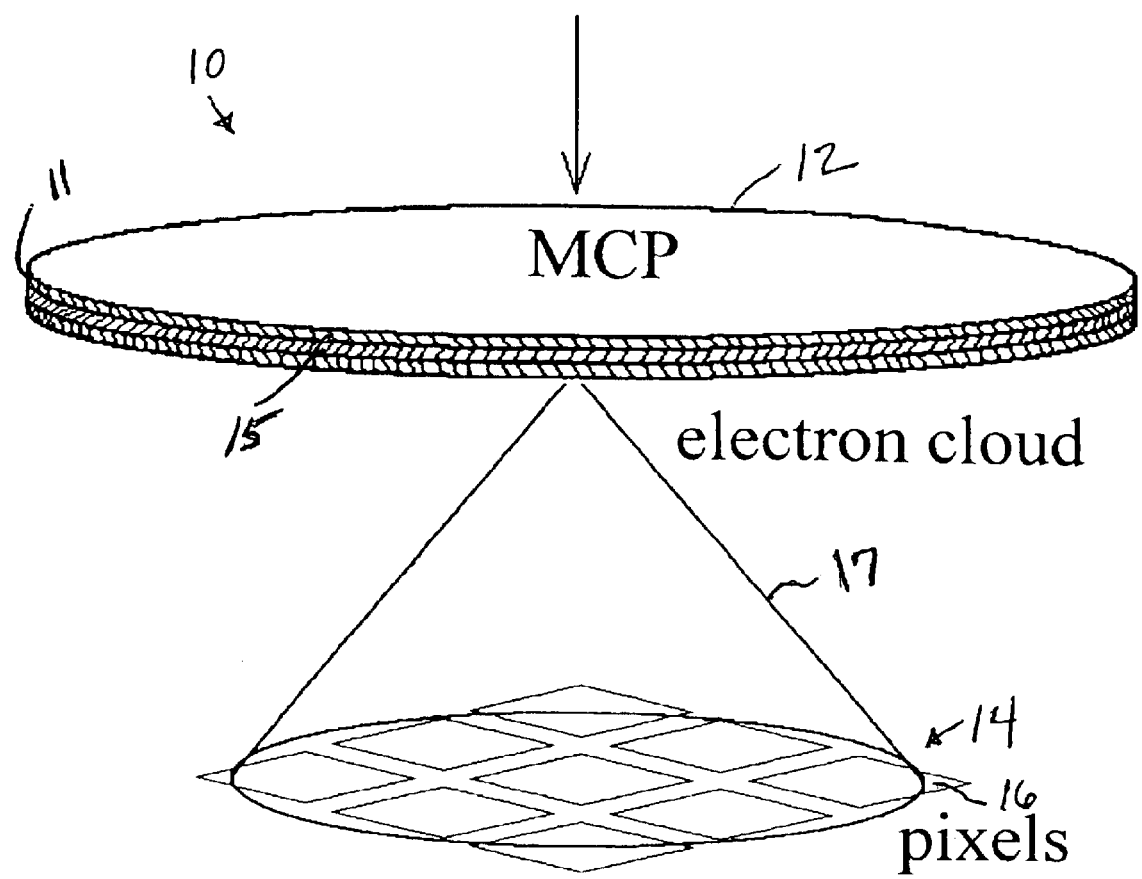
FIG. 1 is a perspective view of a detector system with a MCP and pixel array readout.

FIG. 1 shows a detector system 10 consisting of a Micro Channel Plate (MCP) 12 read out by a pixel matrix 14 (e.g. 3×3) of pixels 16. While the invention is not limited to this application, it is well suited to this type of detector system. By a suitable choice of the photocathode or input converter 11 of MCP 12, detector system 10 may be employed to detect photons on a very broad range of wavelengths, from infrared to low energy X-rays as well as different particles, such as neutrons and electrons. The intrinsic position resolution of an MCP is substantially better than that of a semiconductor pixel detector, for two reasons. First, the diameter of an MCP pixel, the pore 15, is typically 10 $\mu$m in present MCPs and will be reduced to about 0.5 $\mu$m in new MCPs.

Secondly, in a semiconductor detector the lateral spread of the charge cloud 17 is determined by the delta-electrons, while in an MCP it is limited by the MCP pore size. The only way of retaining this feature by a pixel readout of the type shown in FIG. 1 is by making use of position interpolation. A spatial resolution substantially better than the geometric size of the sensing electrodes can be reasonably expected from this approach. A remarkable improvement over the existing imaging techniques may be expected in such an important field as mammography.

In an actual pixel design, the pixel size is 100 μm×100 μm. Simulation shows that a position resolution of 10 μm, i.e., ten times smaller than the pixel size, is obtainable by interpolation provided that the charge be spread over more than three pixels in each direction (X and Y). The improvement in space resolution introduced by an increase in the number of pixels on which the interpolation is carried out (e.g. five in each direction) is not such to justify the increased complexity in the centroid finding logic. However, in the unidimensional case (strip detector), where the centroid algorithm is simpler, the interpolation is done on five elements. One more important feature of the MCP is its timing accuracy, which makes the detector system of FIG. 1 particularly suitable for time-resolved and time-correlated applications.

The invention was developed to support a broad spectrum of applications using highly segmented detectors, particularly pixel matrices and, as a particular case thereof, microstrip structures.

A fundamental part of any readout system associated with a highly segmented detector is the elementary cell in the case of a pixel readout or the individual channel in the case of a microstrip readout. The former case sets obviously more stringent area limitations, for the pixel size in the matrix fixes the limit to the silicon area available for the elementary cell. The goal for the invention was a cell complying with the pixel area limitations, whose layout, in the case of a microstrip readout, would be modified to benefit from the more relaxed constraints in the area available.

The application considered of highest importance and originality is the acquisition and processing of charge and time information associated with the signals delivered by the pixels in a detector of the type of FIG. 1.

The following features were targets to be achieved with the elementary cell.

Must be able to operate at high rates, between $10^6$ and $10^7$ $s^{-1}$.

Its input-equivalent noise charge (ENC) must be in the 500 e region at a detector capacitance of 2 pF.

Must provide timing accuracy in the subnanosecond region on a broad range of input charge values.

Must be able to resolve in real time clusters of events, implying a deadtime of less than about 100 ns.

Must be based upon a radiation hard implementation.

Figure 2:
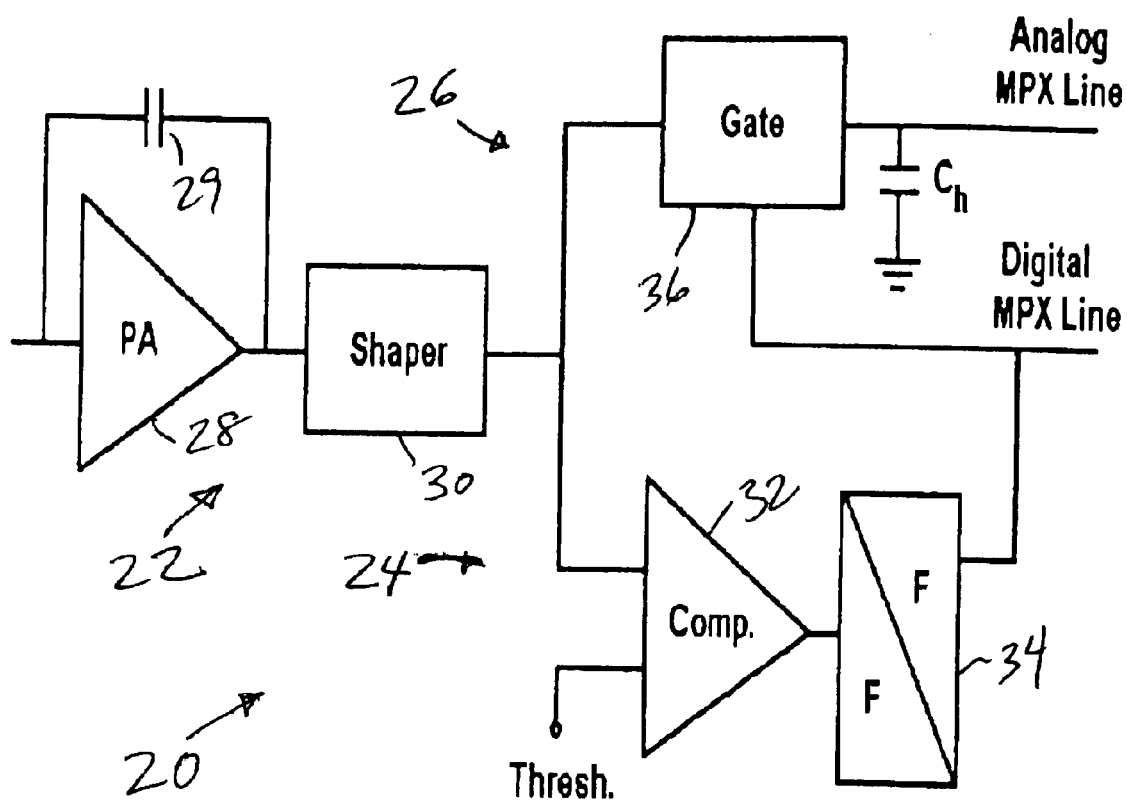
FIG. 2 is a block diagram of an elementary pixel cell.

An elementary cell 20 shown in FIG. 2 consists of a linear amplifying and shaping channel 22 whose output is split along two lines. One is a high accuracy timing channel 24 based upon a constant fraction approach which provides the event timing and also the sequencing signals. The other is an amplitude storage line 26, basically a peak sensing analog memory whose operation is controlled by the timing circuitry.

Amplifying and shaping channel 22 of elementary cell 20 is made up of a preamplifier 28 followed by a pulse shaper 30. The output of pulse shaper 30 is input into one input of comparator 32 in timing channel 24. A threshold value is applied to the other input of comparator 32. The output of comparator 32 is input to a flip-flop (F/F) 34 whose output is a timing signal. The output of pulse shaper 30 is also input to gate 36 in storage line 26. The timing signal from F/F 34 is applied as a gating signal to gate 36. The output of gate 36 is stored in storage capacitor $C_h$.

The whole acquisition and processing system will be realized by providing an elementary cell 20 for each pixel to be processed and by adding circuits that implement additional functions like centroid finding. The centroid will be determined by applying a suitable algorithm to the values of the charge stored in the analog memories associated with the pixels that belong to a given submatrix, e.g., the nine-unit region in FIG. 1.

The complete multiparametric readout system will be built-up by arranging the elementary cells in a monolithic matrix to match the pixel mosaic. The transmission of the acquired and processed information to the outside world will be based upon a column readout architecture.

The basic cell 20 of FIG. 2 may also provide the basis for the development of a microstrip readout system based upon the same concepts illustrated for the case of the pixel matrix. However, in association with a microstrip detector the centroid finding architecture becomes much simpler.

Figure 3:
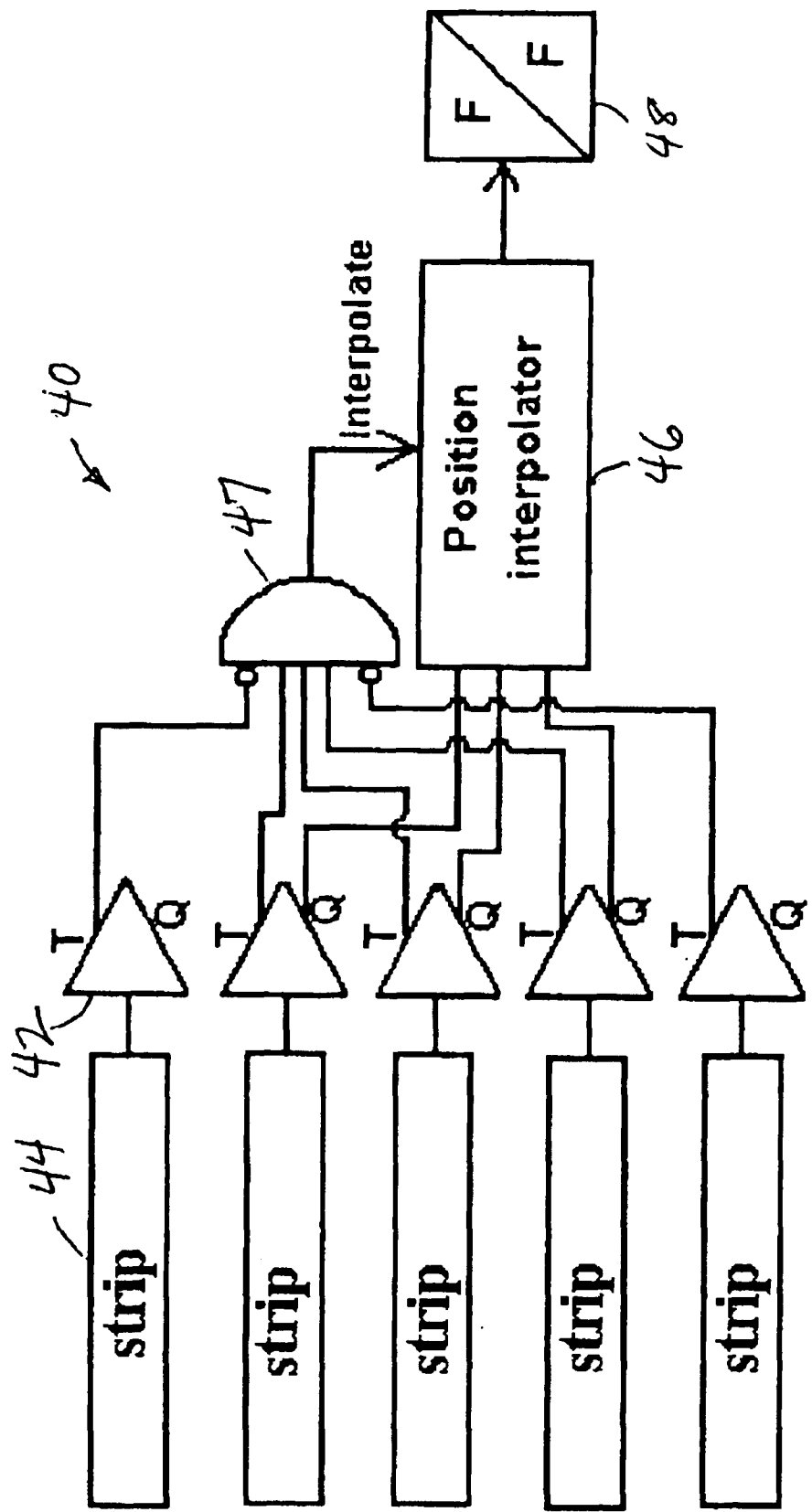
FIG. 3 is a block diagram of centroid finding logic with a microstrip readout.

The circuitry shown in FIG. 3 for three strip position interpolation has five elementary cells 42, each connected to a respective microstrip 44. The Q line out of each of the three inner cells 42 transmits the charge information as it appears on the storage capacitor $C_h$ in FIG. 2 to a position interpolator 46. The T lines carry the timing signals from each elementary cell 42. The position interpolator 46 is enabled by logic gate 47 by the coincidence of the T signals from the three central strips 44 and vetoed by a T signal which may appear on either of the strips 44 above and below the three on which the centroid is evaluated. The circuit function can be easily extended to situations involving a larger number of strips. Interpolator 46 triggers flip-flop 48.

The elementary cell has been designed in two versions that differ for the geometry of the input active device in the preamplifier and for its standing current. One version is intended for pixel applications for detector capacitances up to 200 fF, the other is tailored for larger pads and short strips up to a detector capacitance of 2 pF.

The design can achieve extremely low noise performances at shaping times of a few tens of nanoseconds, to enable the cell to operate at very high hit rates.

As an example of a system based on the elementary cell of FIG. 2, a microstrip readout utilizing the logic cluster selection of FIG. 3 has been fabricated in a CMOS 0.5 micron process. The next step will be a pixel readout system for a microchannel plate.

The Elementary Cell

A. Preamplifier Design

In the most advanced CMOS processes with a gate oxide thickness of 10 nm or less, the choice of a P-channel as a preamplifier input device, driven by the need of reducing the 1/f-noise is no longer mandatory. N-channel MOSFETs of a thin oxide process have the advantage of a larger transconductance-to-standing current ratio $g_m/I_d$ over P-channel MOSFETs, yet feature an acceptably small 1/f-noise. An N-channel MOSFET is preferred as the input active device in the charge-sensitive loop in FIG. 2. In an illustrative version intended for larger capacitances, up to 2 pF, the input MOSFET has a gate width W=300 μm and a length L=1 μm. At a design standing current of 200 μA it features a transconductance $g_m$ of 3.3 mS. In a version for smaller detector capacitances, below 200 fF, the input device has a gate width W=30 μm and a length L=1 μm. At a standing current of 20 μA it features a transconductance of 0.33 mS, both being the $g_m$ values provided from simulations. The feedback capacitor 29 (FIG. 1) is 0.14 pF in both configurations.

B. Pulse Shaper Design

For the shaper 30 that follows the preamplifier 28 in FIG. 2, a monolithic CMOS implementation has been adopted. The idea was to implement in a monolithic chip a triangular or trapezoidal shaper that in a discrete design would rely upon delay lines.

For this purpose a delay unit was required. It has been realized with a feedback, unity gain buffer. The Laplace-domain operator $(1-e^{-sT})$, where s is the complex variable, has been obtained in the block diagram of FIG. 4 A. Pulse shaper 30 includes a difference amplifier D having one input directly connected to an input signal and a second input connected to a delayed input signal through buffer B.

Figure 4A:
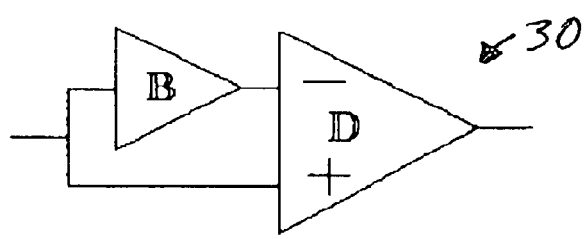
FIGS. 4 A, B are block and circuit diagrams respectively of a pulse shaper of the invention.
Figure 4B:
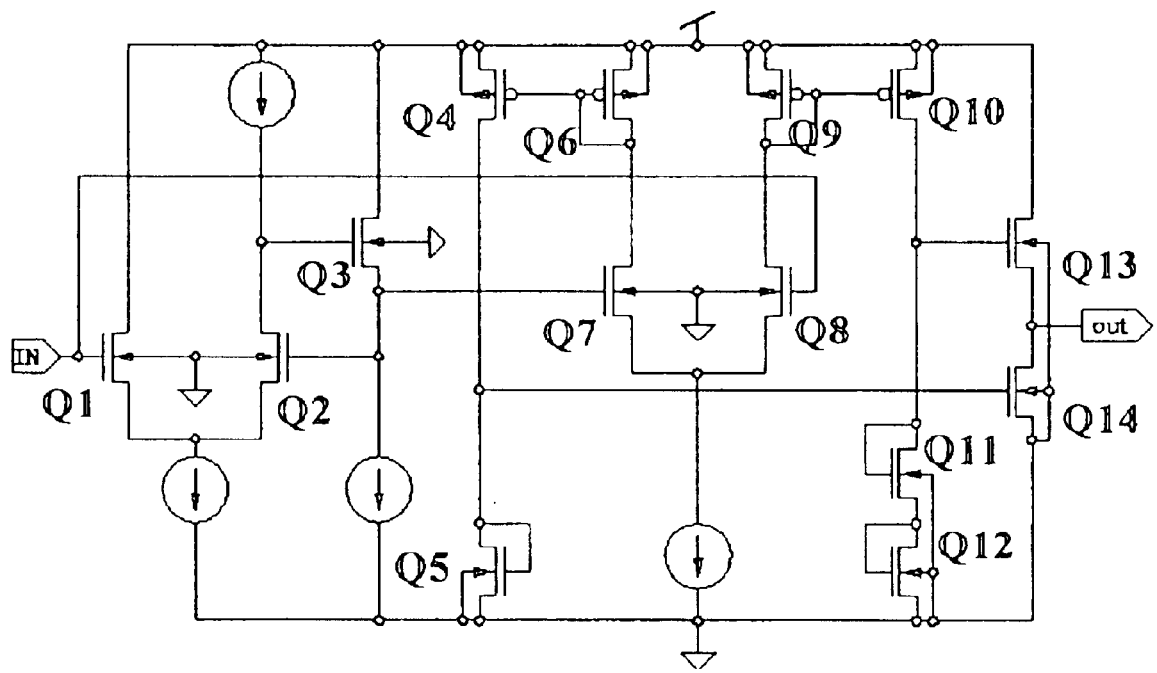

In an illustrative circuit shown in FIG. 4 B, the buffer B is made of the long-tailed transistor pair Q1, Q2, the source follower Q3 and associated current sources. Difference amplifier D, made of transistors Q4 through Q14, is an open-loop structure. Nonetheless, its linearity is good because of distortion-compensation in both signal paths (Q7 Q6 Q4 Q5 Q14) and (Q8 Q9 Q10 Q11 Q12 Q13).

The delay-based shaping concept and its implementation are a part of the invention. Within a given CMOS process, the delay from the feedback unity-gain buffer is stable and reproducible to the extent required by the application.

C. Elementary Cell Architecture

Figure 5:
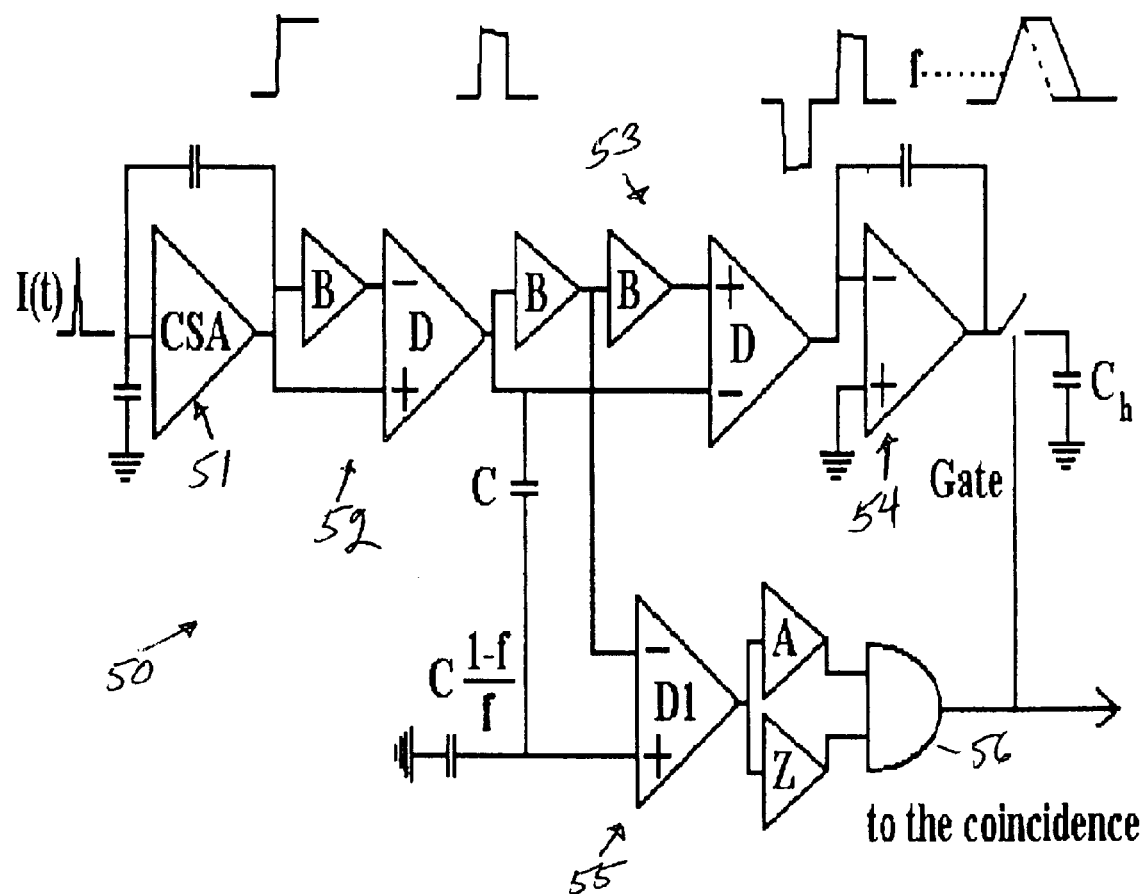
FIG. 5 is a block diagram of the architecture of an elementary cell.

The complete architecture of an elementary cell 50 with associated waveforms is shown in FIG. 5. An impulse I(t) is input into a charge sensitive preamplifier (CSA) 51 with capacitive feedback to produce a step pulse. The output of CSA 51 is input into a first shaper unit 52 which is formed of a difference amplifier D with a unity gain buffer at one input (as in FIG. 4 A). The signal at the output of the first shaper unit 52, the one implementing the $(1-e^{-sT})$ operator, splits along two lines. The upper one completes the shaping by introducing a second delay-line operator $(1-e^{-2sT})$ to multiply the first one. This is done by a second shaper unit 53 which is formed of a difference amplifier D with a pair of unity gain buffers B in series at one input. The resulting bipolar signal goes to an integrator 54 that produces at its output a trapezoidal signal. The output signal from integrator 54 is gated by a gate signal from the lower signal path to a storage capacitor $C_h$.

The lower signal path includes a constant-fraction trigger which provides the hit timing and the control of the charge storage circuit. The presence of a flat-top in the trapezoidal shaper and the timing accuracy of the constant fraction trigger guarantee that the ballistic errors and the amplitude loss in the storage operation be kept very small.

D. The Timing Circuit

The timing circuit is a constant fraction discriminator 55. Its implementation benefits from the delay-based approach adopted for the shaper formed of shaper units 52, 53. The core of CFD 55 is the multistage difference amplifier D1. This subtracts the signal at the output of the first shaper section 52, attenuated by the capacitive divider C, C(1−f)/f, which defines the constant fraction f, from a signal taken from a node inside the pair of buffers B in the second shaper section 53. The amplified difference signal, by virtue of the large amplification, features a very steep slope at the crossover point, whose time of occurrence is detected by a zero-crossing discriminator Z to provide the time definition of the hit. The output of D1 is input into both Z and a preset (arming) circuit (discriminator) A whose outputs are input into AND gate 56 to form the gating signal to gate the output of integrator 54.

Circuit Behavior

Figure 6A:
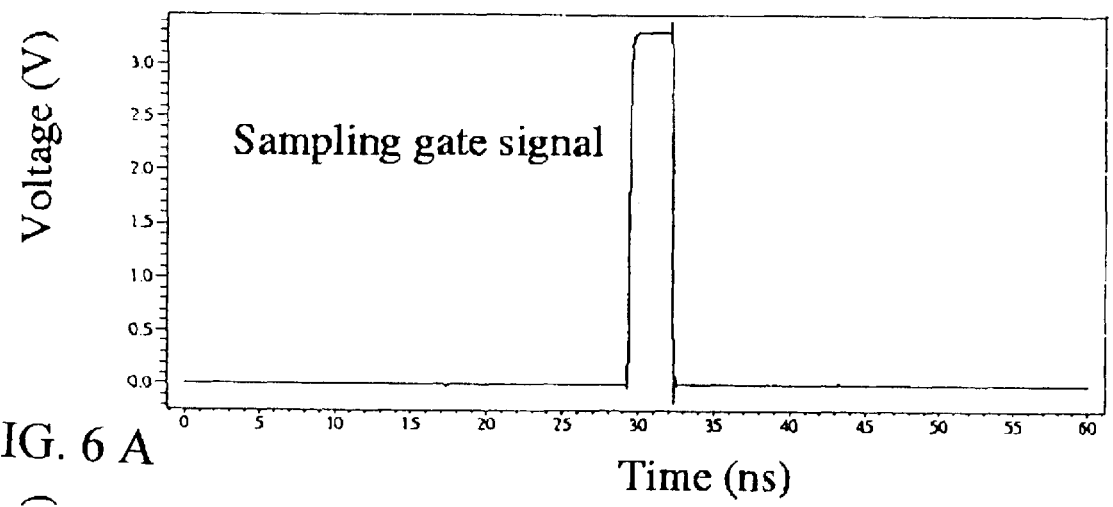
FIGS. 6 A, B are sampling gate signal and pulse shaper output signal waveforms respectively.
Figure 6B:
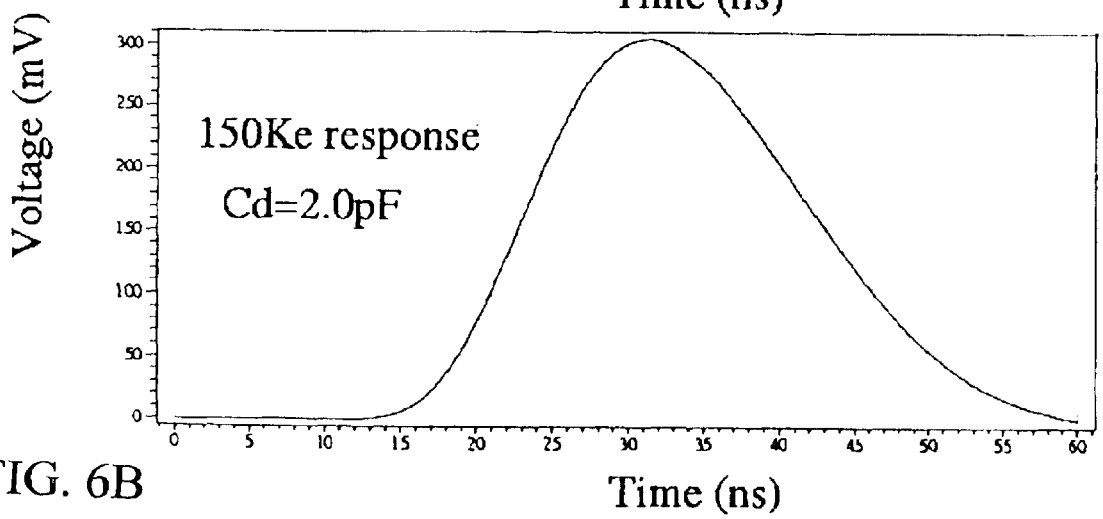

The signals provided by the constant fraction trigger and the trapezoidal integrator output are shown in FIGS. 6 A, B.

In a version to be fabricated in 0.5 micron process, the circuit of FIG. 5 is intended for operation with values of the input charge ranging between $2\times10^4$ and $5\times10^5$ electrons.

The analog signal of FIG. 6 B obtained from the shaper in response to a delta-impulse current from the detector approaches closely to the target trapezoidal waveform. It has a well pronounced rounded top, which makes the sampling operation very accurate. It has a shape, with almost symmetric leading and trailing portions and features a regular, monotonic recovery to the baseline. These characteristics, associated with its short basewidth, about 45 ns according to FIG. 6 B, make the circuit suitable for operation at very high hit rates.

The signal shape of FIG. 6 B is the same regardless of whether the charge-sensitive loop employs the larger or the smaller input transistor. This is due to the choice of the geometry and of the value of the standing currents which, as pointed out above, provides in either case a value of the transconductance which is proportional to the largest value of the detector capacitance foreseen for each configuration. This results in a preamplifier risetime which has little dependence on the detector capacitance the cell is operating with, thus affecting the final shaped signal only to a negligible extent.

The logic signal of FIG. 6 A is the gating command provided by the timing circuitry. Comparison of the time relationship of FIGS. 6 A and B shows that the storage of the analog amplitude is achieved with a high degree of timing accuracy, in correspondence of the center of the rounded top of the analog signal.

The simulated noise behavior for the two versions of the cell was investigated with reference to the delta-response of FIG. 6 B. The cell employing the charge sensitive loop with the larger input transistor, W/L=300/1 operating at a 200 $\mu$A standing current, features an equivalent noise charge ENC of 550 e rms at a 2 pF detector capacitance.

Figure 7:
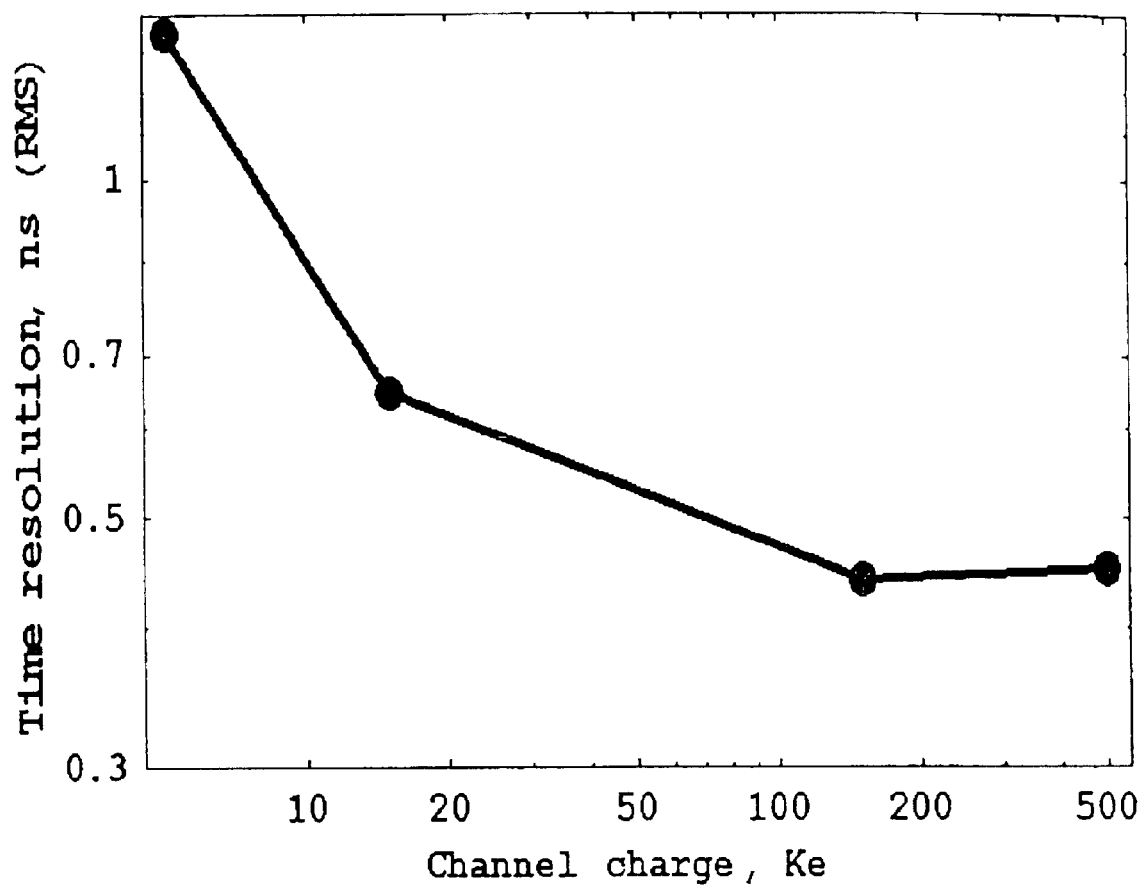
FIGS. 7, 8 are graphs of noise-induced dispersion of the triggering instance of the timing circuit as a function of injected charge for two values of detector capacitance.

The noise-induced time-resolution variance $\sigma$ in the triggering instant of the timing circuit is plotted in FIG. 7 as a function of the charge injected at the input by a delta-impulse. The plot of FIG.7 shows that the noise-induced dispersion of the triggering remains almost constant for input charge exceeding $2\times10^4$ electrons. This indirectly proves that the slope at the crossover point of the signal presented at the zero crossing discriminator is independent of the injected charge value. This independence results in a limited time walk which is less than 1 ns over the entire range of input charge values, from $2\times10^4$ to $5\times10^5$ electrons.

The cell employing the charge sensitive loop with the smaller input transistor, W/L=30/1 operating at a 20 $\mu$A standing current, features an equivalent noise charge ENC of 240 e rms at a 0.2 pF detector capacitance. The noise-induced time-resolution variance $\sigma$ in the triggering instant of the timing circuit is plotted in FIG. 8 as a function of the charge injected at the input by a delta-impulse.

Figure 8:
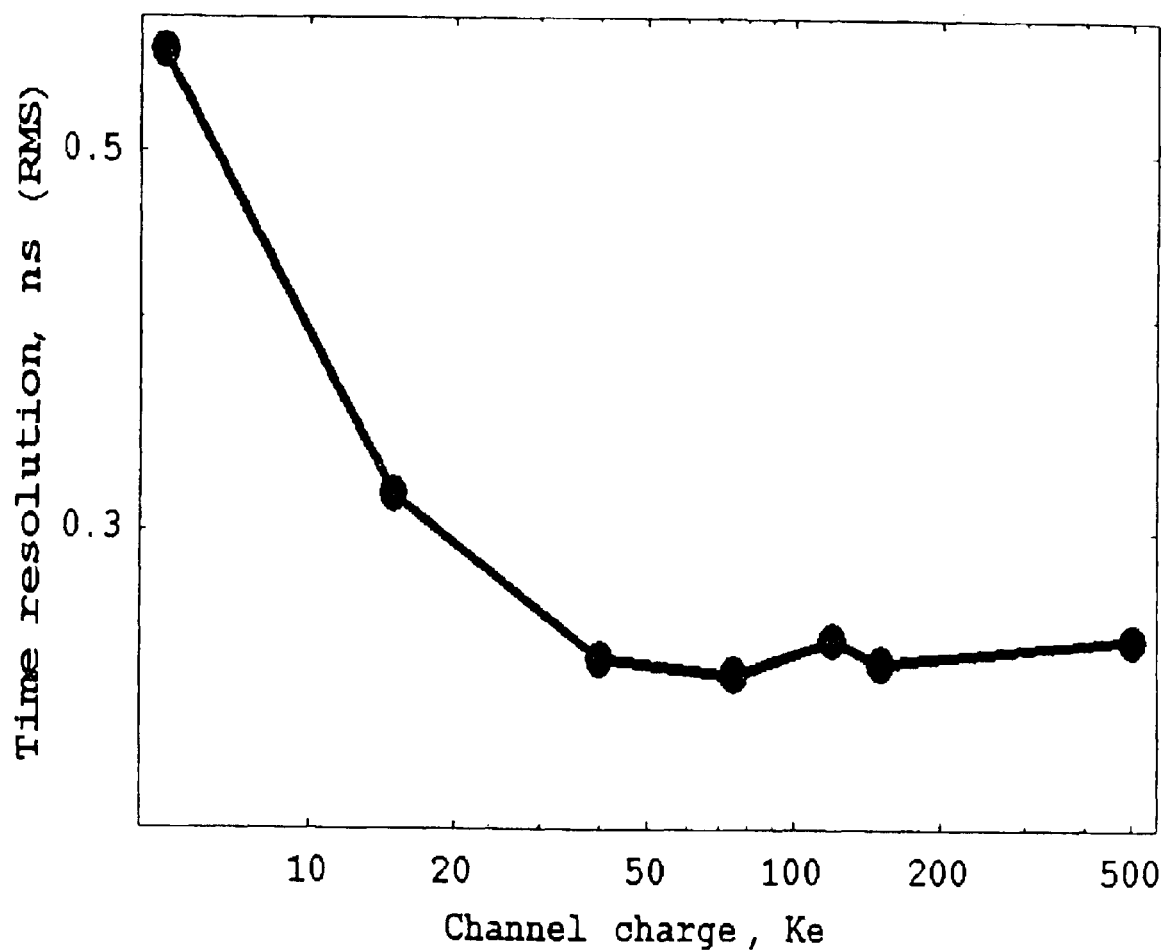

Comparison between the curves of FIGS. 7 and 8 shows that the values of the noise-induced dispersion in either version of the elementary cell are approximately proportional to the relevant ENC, which confirms that the values of the slope at the crossover point are independent of the geometrical features and standing current of the input device in the charge-sensitive loop. This is one more benefit of having designed the two versions with the criterion of having the same risetime in the charge-sensitive loop.

The value of ENC has a good degree of uniformity across the chip. This is related to the large size of the input transistor in the preamplifier, which results in little dispersion in the transconductance, the parameter which governs the dominant noise source, the channel thermal noise. The channel-to-channel ENC dispersion has been evaluated to be less that 5%, a value which has been confirmed experimentally by previous implementations of other chips.

The offset contribution to the comparator threshold dispersion across the chip was estimated to be about 2.5 mV rms. This value is determined to a large extent by the gate area 24 μm×0.5 μm of the balanced amplifier at the comparator input. A larger area would have resulted in a smaller threshold dispersion, which however would have impaired the triggering speed of the comparator.

The static power dissipation in the cell designed for larger capacitances, whose input device operates at a higher current, is 3 mW. As the only difference between the two cells is in the input device, the static power dissipation in the cell designed for small capacitances is slightly less, as determined by the difference in the input transistor current (20 μA against 200 μA). Considering the low noise and accurate timing performance of the cell, the above power levels are fully satisfactory. A substantial power reduction can be achieved by relaxing the constraint of a low noise charge measurement at shaping times over 50 ns.

A monolithic readout system for highly segmented radiation detectors is provided by the invention, based upon the elementary cell described above. The system stores the value of the charge associated with the detector signal to allow position evaluation by charge interpolation and performs an accurate determination of the time of occurrence of the signals.

The low noise, high counting rate and timing accuracy are attributed to the pulse shapers that follow the charge-sensitive loop. These pulse shapers transfer onto a silicon chip the concept of a trapezoidal shaper which in a discrete circuit realization would rely upon delay lines.

Changes and modifications in the specifically described embodiments can be carried out without departing from the scope of the invention which is intended to be limited only by the scope of the appended claims.

What is claimed is:

1. An elementary cell, comprising:
    an amplifying and shaping circuit;
    an amplitude storage circuit connected to the output of the amplifying and shaping circuit; and
    a timing circuit connected to the output of the amplifying and shaping circuit and providing a timing signal to the amplitude storage circuit;
    wherein the amplifying and shaping circuit comprise in series:
    a preamplifier; and
    a pulse shaper.

2. The elementary cell of claim 1 wherein the pulse shaper comprises:
    a difference amplifier having one input directly connected to an input signal;
    a unity gain buffer connected between the input signal and a second input of the difference amplifier to provide a delayed input signal.

3. The elementary cell of claim 2 wherein the pulse shaper is implemented in a monolithic CMOS chip.

4. The elementary cell of claim 1 wherein the preamplifier is a charge sensitive preamplifier.

5. The elementary cell of claim 4 wherein the preamplifier is an N-channel MOSFET.

6. An elementary cell, comprising:
    an amplifying and shaping circuit;
    an amplitude storage circuit connected to the output of the amplifying and shaping circuit; and
    a timing circuit connected to the output of the amplifying end shaping circuit and providing a timing signal to the amplitude storage circuit;
    wherein the timing circuit comprises a constant fraction discriminator.

7. The elementary cell of claim 6 wherein the timing circuit comprises in series:
    a comparator having one input connected to the output at the amplifying and shaping circuit and a second input connected to a threshold value; and
    a flip-flop connected to the output or the comparator.

8. An elementary cell, comprising:
    an amplifying and shaping circuit;
    an amplitude storage circuit connected to the output of the amplifying and shaping circuit; and
    a timing circuit connected to the output of the amplifying and shaping circuit and providing a timing signal to the amplitude storage circuit;
    wherein the amplitude storage circuit comprises a peak sensing analog memory.

9. The elementary cell of claim 8 wherein the amplitude storage circuit comprises an integrator whose output is gated by the timing circuit and a storage capacitor connected to the gated output of the integrator.

10. An elementary cell, comprising:
    an amplifying and shaping circuit;
    an amplitude storage circuit connected to the output of his amplifying and shaping circuit; and
    a timing circuit connected to the output of the amplifying and shaping circuit and providing a timing signal to the amplitude storage circuit;
    wherein the amplifying and shaping circuit and the amplitude storage circuit comprise in series;
    a first pulse shaping section; and
    a second pulse shaping section.

11. The elementary cell of claim 10 wherein:
    the first pulse shaping section comprises a first difference amplifier having one input directly connected to an input signal and a unity gain buffer connected between the input signal and a second input of the first difference amplifier to provide a delayed input signal; and
    the second pulse shaping section comprises a second difference amplifier having one input directly connected to the output of the first difference amplifier and a pair of unity gain buffers connected in series between the output or the first difference amplifier and a second input of the second difference amplifier to provide a delayed input signal.

12. An acquisition and processing system for a segmented detector, comprising:
    a plurality of detector elements;
    a plurality of elementary cell, one connected to each detector element, each cell comprising;
    an amplifying and shaping circuit;
    an amplitude storage circuit connected to the output of the amplifying and shaping circuit; and
    a amplitude circuit connected to the output of the amplifying and shaping circuit and providing a timing signal to the amplitude storage circuit.

13. The acquisition and processing system of claim 12 wherein the detector elements are selected from pixels and microstrips.

14. The acquisition and processing system of claim 12 wherein the pulse shaper comprises:
    a difference amplifier having one input directly connected to an input signal;
    a unity gain buffer connected between the input signal and a second input of the difference amplifier to provide a delayed input signal.

15. The elementary cell of claim 14 wherein the pulse shaper is implemented in a monolithic CMOS chip.

* * * * *